United States Patent [19]

Miura et al.

[11] Patent Number: 4,984,032
[45] Date of Patent: Jan. 8, 1991

[54] SEMICONDUCTOR PHOTODIODE

[75] Inventors: Shuichi Miura, Kawasaki; Takashi Mikawa, Tokyo; Haruhiko Kuwatsuka, Yokohama; Nami Yasuoka, Hachioji, all of Japan

[73] Assignee: Fujitsu Limited, Kawasaki, Japan

[21] Appl. No.: 297,391

[22] Filed: Jan. 17, 1989

[30] Foreign Application Priority Data

Jan. 18, 1988 [JP] Japan .................. 63-7702

[51] Int. Cl.$^5$ .................. H01L 29/161; H01L 29/90; H01L 27/14
[52] U.S. Cl. ........................................ 357/16; 357/30; 357/13
[58] Field of Search ............... 357/13, 16, 30 A, 30 B, 357/30 L

[56] References Cited

U.S. PATENT DOCUMENTS

| | | | |
|---|---|---|---|
| 4,110,778 | 8/1978 | Eden et al. | 357/30 |
| 4,203,124 | 5/1980 | Gordon et al. | 357/16 |
| 4,403,397 | 9/1983 | Bottka et al. | 357/30 |
| 4,561,007 | 12/1985 | Webb | 357/30 A |
| 4,656,494 | 4/1987 | Kobayashi et al. | 357/16 |

FOREIGN PATENT DOCUMENTS

| | | |
|---|---|---|
| 0076495 | 4/1983 | European Pat. Off. |
| 0163295 | 12/1985 | European Pat. Off. |
| 0242298 | 10/1987 | European Pat. Off. |
| 60-105281 | 6/1985 | Japan |

OTHER PUBLICATIONS

IEEE Journal of Quantum Electrons, vol. QE-17, No. 2, Feb. 1981, "Ga$_{1-x}$Al$_x$SB Avalanche Photodiodes: Resonant Impact Ionization with Very High Ratio of Ionization Coefficients", by O. Hildebrand et al., pp. 284-288.

Primary Examiner—Rolf Hille
Assistant Examiner—Wael Fahmy
Attorney, Agent, or Firm—Staas & Halsey

[57] ABSTRACT

An APD includes a substrate formed of n$^+$-type Al$_x$Ga$_{1-x}$Sb or Al$_x$Ga$_{1-x}$Sb$_y$As$_{1-y}$ semiconductor, whose aluminum content ratio x is typically within a range from 0.1 to 0.3. A light absorbing layer is formed of an-type GaSb semiconductor on the substrate. An avalanche multiplication layer is formed of n-type Al$_x$Ga$_{1-x}$Sb or Al$_x$Ga$_{1-x}$Sb$_y$As$_{1-y}$ semiconduct, whose aluminum content ratio x is from 0.02 to 0.1, typically 0.065, so that an ionization rate ratio of positive and negative carriers is essentially maximized by a resonant impact ionization phenomenon. A p$^+$-region is formed as a surface layer of n-type Al$_x$Ga$_{1-x}$Sb or Al$_x$Ga$_{1-x}$Sb$_y$As$_{1-y}$ semiconductor on the avalanche multiplication layer or directly in the avalanche multiplication layer so as to form a pn junction. Electrodes are formed on the p-type region and the substrate so as to apply a bias voltage to the APD. A light to be detected is injected through the substrate via an opening in the substrate electrode, while producing no carriers therein, into the light absorbing layer. The avalanche multiplication layer generates resonant impact ionization with only the positive carriers from the light absorbing layer, so that low noise and fast operation of the APD is achieved. Furthermore, the APD structure of the invention allows for easy design of an APD.

20 Claims, 4 Drawing Sheets

SEMICONDUCTOR PHOTODIODE

BACKGROUND OF THE INVENTION

1. Field of the Invention

This invention relates to a semiconductor avalanche photodiode (referred to hereinafter as an APD). More particularly, it relates to an APD which achieves both low noise and high speed operation.

2. Description of the Related Art

Figure 1:
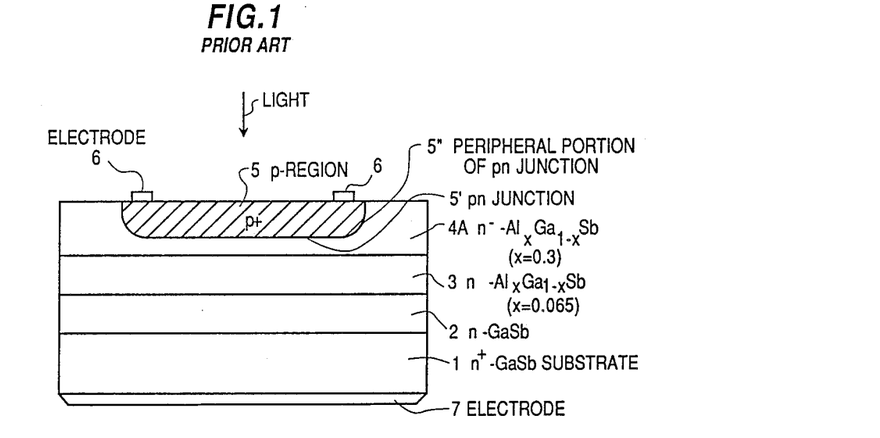
FIG. 1 is a schematic cross-sectional view of a first prior art APD.

Long-distance and high-capacity optical transmission using a wavelength of 10 to 1.7 μm, where the optical transmission loss of a silica optical fiber becomes minimum, has been increasing in practical use. As an optical detector for this type of transmission, many types of APD devices have been developed. A typical one of these APD devices is disclosed in U.S. Pat. Application Ser. No. 037,000, filed Apr. 10, 1987 by the assignee of the subject application. In this prior application, as schematically illustrated in FIG. 1, the numeral 1 denotes an n+-type GaSb substrate; the numeral 2 denotes an n-type GaSb light absorbing layer; the numeral 3 denotes an n-type $Al_xGa_{1-x}Sb$ avalanche multiplication layer, where x=0.065; the numeral 4A denotes an n-type $Al_xGa_{1-x}Sb$ window layer, where x=0.3, having a band gap energy larger than that of the avalanche multiplication layer 3; and the numeral 5 denotes a p+-type region doped in the window layer 4A for forming a pn junction. Some thickness of the window layer 4A is left between the pn junction 5' and the avalanche multiplication layer 3, and a light to be detected is irradiated through the $p^{30}$-type region 5 into the light absorbing layer 2. The above-described material of the avalanche multiplication layer 3 generates a high ionization rate of positive holes to that of electrons by a resonant impact ionization phenomenon, resulting in the achievement of both low noise and high speed operation of the APD. The resonant impact ionization is described by o Hilderbrand et al. in IEEE Journal of Quantum Electronics, Vol. QE-17, No. 2, p. 284–288, February, 1981.

Figure 2:
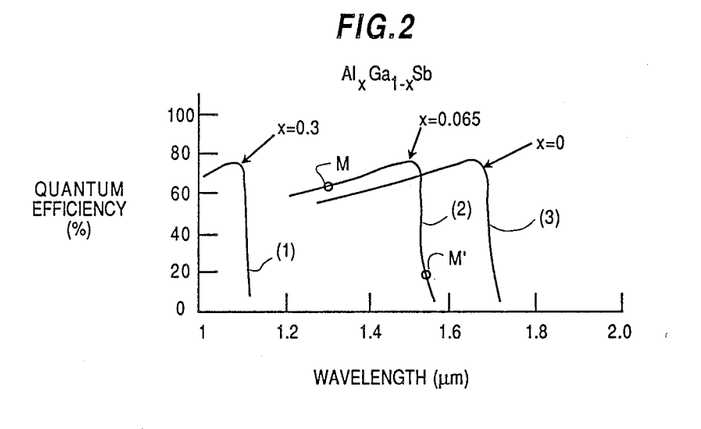
FIG. 2 is a graph of quantum efficiency versus incidental wavelength for various aluminum content ratios of Al$_x$Ga$_{1-x}$Sb.

The problems with the above-described prior art APD are discussed below. In FIG. 2, the quantum efficiency characteristic which is an average number of electrons or positive holes photoelectrically emitted in a photoelectric material per incidental photons (i.e., a unit intensity of light) thereto versus the incidental wavelength, is presented. Incidental light having a 1.3 μm wavelength produces both types of carriers, i.e., electrons and positive holes, in the avalanche multiplication layer 3 for x=0.065, as indicated by a notation "M", even though the light should pass therethrough without producing carriers therein. The most important aspect of employing resonant impact ionization to reduce the noise generation is obtained when only positive carriers are injected from the light absorbing layer 2 into the avalanche multiplication layer 3. Accordingly, the undesirable generation of both types of carriers (i.e., electrons and positive holes), in the multiplication layer 3 deteriorates the pure generation of the resonant impact ionization. As a result, the low noise characteristics of the APD are deteriorated. The same problem still exists for 1.55 μm wavelength incident light as indicated by a notation "M'", though the amount of the produced carriers is much less.

Figure 3:
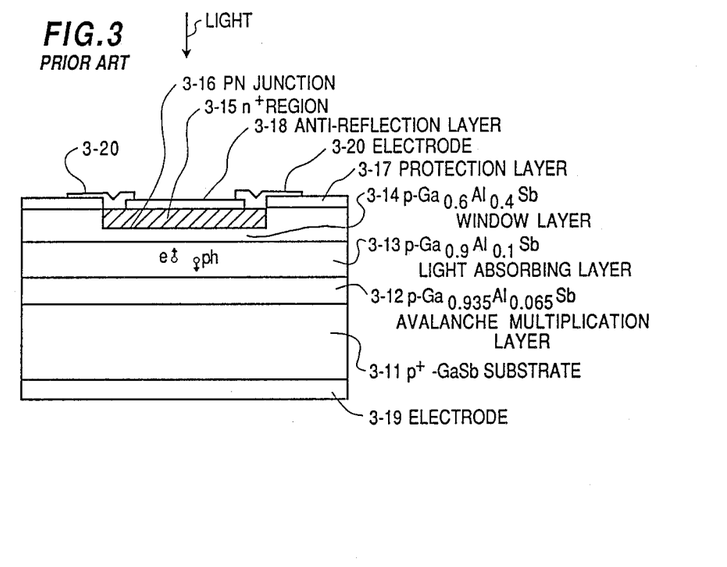
FIG. 3 is a schematic cross-sectional view of a second prior art APD.

Another prior art APD is disclosed in Japanese Unexamined Patent Publication Sho 60-105281 which is assigned to the assignee of the subject application and which is schematically illustrated in FIG. 3. In FIG. 3, the numeral 3-11 denotes a p+-type GaSb substrate, and the numeral 3-12 denotes a p-type $Ga_{0.935}Al_{0.065}Sb$ avalanche multiplication layer which generates a resonant impact ionization phenomenon. The numeral 3-13 denotes a p-type $Ga_{0.9}Al_{0.1}Sb$ light absorbing layer, and the numeral 3-14 denotes a p-type $Ga_{0.6}Al_{0.4}Sb$ window layer. The numeral 3-15 denotes an n+-type region doped in the window layer 3-14 for forming a pn junction, and the numeral 3-18 denotes an anti-reflection layer. The numerals 3-19 and 3-20 denote electrodes for applying a bias voltage to the APD. The light to be detected is injected through the n+ region 3-15 into the light absorbing layer 3-13. Accordingly, the light does not have to pass through the avalanche multiplication layer 3-12. Therefore, the problem of the prior art APD of FIG. 1 is avoided. However, other problems are created therein. Because of the longer distance between the pn junction 3-16 and the avalanche multiplication layer 3-12, any fluctuations in the impurity density or the thickness, etc., of the layers therebetween in the fabrication process seriously affect the APD characteristics. Furthermore, currently available diffusion source materials, such as sulfur or selenium, for forming the n region 3-15, are difficult to work with to achieve an adequate diffusion depth, resulting in difficulties in designing and fabricating the $n^{30}$ region 3-15.

Figure 4:
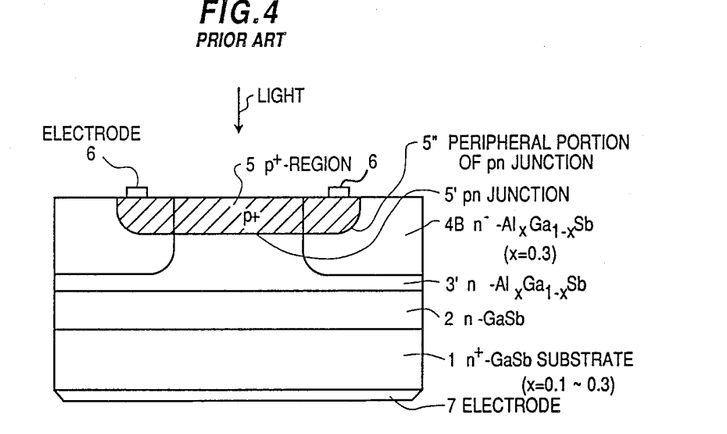
FIG. 4 is a schematic cross-sectional view of a third prior art APD.

A third prior art APD is schematically illustrated in FIG. 4, where the same or like numerals denote the same or corresponding portions of the APD of FIG. 1. A substrate I, and a light absorbing layer 2 are the same as those of FIG. 1. An avalanche multiplication layer 3' is formed of the same material in the same way as the FIG. 1 APD. However, the layer 3' is formed in a mesa shape. A peripheral portion of the mesa is filled with the same material as that of the window layer 4A of FIG. 1, so as to form a guard ring 4B. Into the surfaces of the mesa-shaped layer 3' and an adjacent part of the guard ring 4B, zinc is diffused approximately 1 μm deep to form a $p^{30}$-type region 5. The $p^{30}$-type region 5 forms a pn junction 5' with the avalanche multiplication layer 3' as well as the guard ring 4B. The pn junction also has a peripheral portion 5". A light to be detected is injected through the $p^{30}$-type region 5 into the light absorbing layer 2. The disadvantage of the prior art APD of FIG. 4 is the same as that of the prior art APD of FIG. 1.

SUMMARY OF THE INVENTION

It is an object of the present invention to provide an APD having low noise and high speed characteristics.

It is another object of the invention to provide an APD having an improved quantum efficiency.

It is still another object of the invention to provide a wide margin for fabrication fluctuations in designing an APD structure.

According to the present invention, a semiconductor substrate formed of $n^{30}$-type $Al_xGa_{1-x}Sb$ or $Al_xGa_{1-x}Sb_yAs_{1-y}$, having x in the range of 0.1 to 0.3 and 0<y<1, allows light to pass therethrough without producing carriers therein. The light passes into a light absorbing layer of n-type GaSb formed on the semiconductor substrate, where the injected light produces carriers. The produced positive carriers are injected into an avalanche multiplication layer formed of n-type $Al_xGa_{1-x}Sb$ or $Al_xGa_{1-x}Sb_yAs_{1-y}$ on the light absorbing layer and having x of approximately 0.065 and 0<y<1. A px-type layer or in a surface layer formed of N-type region is doped in the avalanche multiplication $Al_xGa_1$ $_x$Sb or Al$_x$Ga$_{1-x}$Sb$_y$As$_{1-y}$ on the avalanche multiplication layer and having x of 0.1 to 0.3 and 0<y<11, so as to form a pn junction.

The aluminum content of the material forming the avalanche multiplication layer is chosen so as to produce a high ionization rate ratio by a resonant impact ionization phenomenon. The high ionization rate ratio is generated with only the positive carrier by an electric field induced from the pn junction being located close (i.e., directly or only via the surface layer) to the avalanche multiplication layer. This results in an APD with both low noise and high speed operation.

The above-mentioned features and advantages of the present invention, together with other objects and advantages, which will become apparent, will be more fully described hereinafter, reference being had to the accompanying drawings forming a part hereof, wherein like numerals refer to like parts throughout.

DESCRIPTION OF THE PREFERRED EMBODIMENTS

Figure 5:
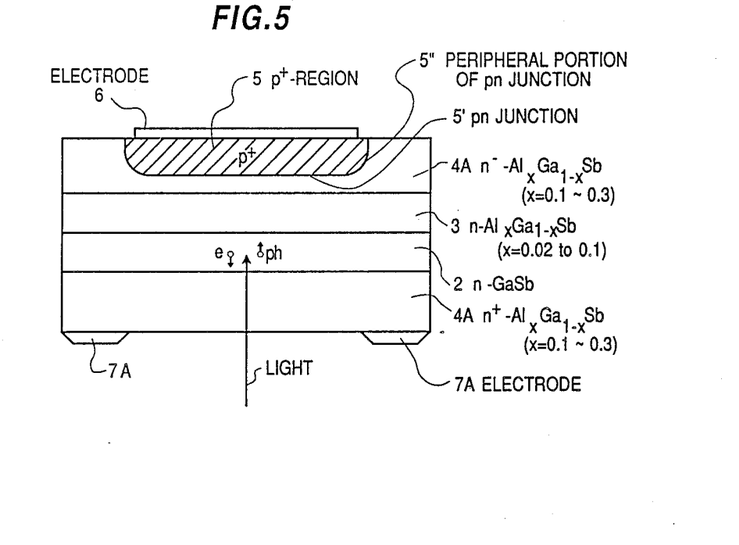
FIG. 5 is a schematic cross-sectional side view of a first embodiment of the present invention.

Referring to FIG. 5, a preferred embodiment of the present invention is hereinafter described in detail. A semiconductor substrate 1A is formed of approximately 350 μm thick n$^{30}$-type Al$_x$Ga$_{1-x}$Sb (aluminum gallium antimony), where x ranges from approximately 0.1 to 0.3, doped typically with, for example, tellurium having an impurity concentration of, for example, $10^{19}$cm$^{-3}$. The substrate 1A is formed by LPE (liquid phase epitaxy), which is described in U.S. Pat. No. 4,620,897, "Method for Growing Multi-Component Compound Semiconductor Crystals", issued Nov. 4, 1986 to K. Nakajima, the content of which is hereby incorporated by reference. With this method, a source can be automatically supplemented into the melt to form a thick substrate. A light absorbing layer 2 is formed of an n-type GaSb (gallium antimony) layer doped typically with tellurium having an impurity concentration of, for example, approximately $5\times10^{15}$cm$^{-3}$. The light absorbing layer 2 has a thickness ranging from 2 to 3 μm and is formed on the semiconductor substrate 1A by a widely known method, such as LPE. An avalanche multiplication layer 3 is formed of n-type Al$_x$Ga$_{1-x}$Sb, where x ranges approximately from 0.02 to 0.1, typically approximately 0.065, and is doped typically with tellurium having an impurity concentration of, for example $5\times10^{15}$cm$^{-3}$. The avalanche multiplication layer 3 has a thickness of approximately 1 μm and is formed on the light absorbing layer 2 by a widely known method, such as LPE. A surface layer 4A is formed of n-type Al$_x$Ga$_{1-x}$Sb, where x ranges from 0.1 to 0.3, doped typically with tellurium having an impurity concentration of $5\times10^{15}$cm$^{-3}$ maximum, for example, $2\times10^{15}$cm$^{-3}$. The surface layer 4A has a thickness ranging approximately from 2 to 3 μm and is formed on the avalanche multiplication layer 3 by a widely known method, such as LPE. At the central portion of the surface layer 4A, a p$^{30}$-type region 5 having an impurity concentration which is typically approximately $10^{19}$cm$^{-3}$, is formed approximately 1 μm deep for forming a pn junction 5' in the surface layer 4A. An approximately 1 μm thickness of the surface layer 4A is left between the pn junction 5' and the avalanche multiplication layer 3. The p$^{30}$-type region 5 is formed by a widely known method, such as diffusion of zinc or ion implantation of beryllium. An electrode 6 is formed by depositing typically Au/Zn/Au (gold, zinc and gold) as thick as 360/60/360 Å for each material on the p$^{30}$-type region 5, and by further depositing thereon typically Au/Ti (gold and titanium) as thick as 2700/300 Å for each material. The electrode 6 is formed by a widely known method, such as sputtering, to apply a negative side of a bias voltage to the APD. A ring-shaped electrode 7A is formed by depositing typically Au/AuGe (gold and gold-germanium alloy) as thick as 2700/300 Å for each material, on a surface of the substrate 1A opposite to the light absorbing layer 2, for connecting a return of the bias voltage. Through an opening at the center portion of the electrode 7A, the incidental light is irradiated on the substrate 1A and into the light absorbing layer 2.

As represented in FIG. 2 by curve (1) for the material having x=0.3 used for the substrate, the quantum efficiency of the wavelengths now in consideration for practical communication use (i.e., mainly 1.3 and 1.55 μm), is nothing. In other words, the incidental light passes through the substrate while producing essentially no carriers therein. The light having passed through the substrate 1A enters into the light absorbing layer 2, where sufficient carriers are produced for a wide range of wavelengths (including both 1.3 and 1.55 μm wavelengths), as represented by curve (2) of FIG. 2 which illustrates sufficient quantum efficiency. The carriers produced in the light absorbing layer 2 are both the positive holes ph and electrons e as denoted in FIG. 3. The produced positive holes ph are accelerated by the electric field induced from the applied bias voltage into the avalanche multiplication layer 3.

Figure 6:
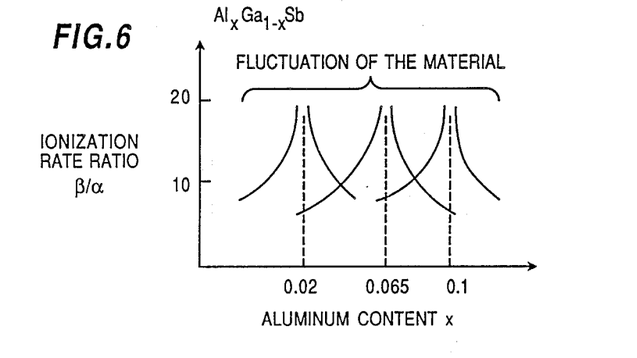
FIG. 6 is a graph for illustrating the effect of aluminum content on ionization rate ratio.

For the avalanche multiplication layer 3, aluminum content x is particularly chosen so that an ionization rate ratio β/α (where β indicates an ionization rate of the positive holes produced therein and α indicates an ionization rate of the electrons produced therein) is remarkably increased. This is referred to as resonant impact ionization. The general concepts of resonant impact ionization are further explained hereinafter. Resonant impact ionization is a phenomenon in which the spin orbit splitting Δ of the valence band becomes equal (thus called resonant) to the band gap energy E$_g$ between the conduction band and the valence band. A large value for the ionization rate ratio β/α is obtained even at a lower voltage than that of the conventional avalanche breakdown which does not employ resonant impact ionization. As is well known, the greater the value of the ionization ratio, the greater the reduction in the fluctuation noise produced in the APD, and the faster the operation of the APD. The particular aluminum content ratio optimum for the maximum ionization rate ratio varies from 0.02 to 0.1, and is typically 0.065, as shown in FIG. 6.

With a sufficient electric field intensity, e.g., approximately $4 \times 10^4$ V/cm, in the avalanche multiplication layer 3, induced from an applied voltage as low as, for example, 12.5 V, on the pn junction 5' located close to the avalanche multiplication layer 3 (in other words, separated by only a 1 μm thick portion of the surface layer 4A), and due to resonant impact ionization, the ionization rate ratio can be as high as more than 20.

The band gap energy of the substrate IA is more than 1 eV. The band gap energy of the light absorbing layer 2 is typically 0.72 eV. The band gap energy of the avalanche multiplication layer 3 is typically 0.8 to 0.83 eV. Because an absorption edge of the quantum efficiency curve is inversely proportional to the band gap energy of the material as shown in FIG. 2, the high band gap energy of the substrate 1A allows the light to pass therethrough while generating no carriers therein. The avalanche multiplication layer 3 having the lower band gap energy generates the resonant impact ionization.

Because the surface layer 4A is formed of $Al_xGa_{1-x}Sb$, where x is from 0.1 to 0.3, it has a lower impurity concentration and a lower ionization rate than the avalanche multiplication layer 3. This results in a relatively high avalanche breakdown voltage. The avalanche breakdown voltage may be, for example, more than 50 V. Also, because of the reduction in the concentration of electric field at peripheral portion 5'' of the pn junction, the surface layer 4A contributes to reduce a tunnel current flowing therethrough, i.e., a dark current of the APD, even though a guard ring, which has been widely employed in APD's in order to reduce the peripheral electric field concentration, is not provided in the APD of the embodiment shown in FIG. 5.

Figure 7:
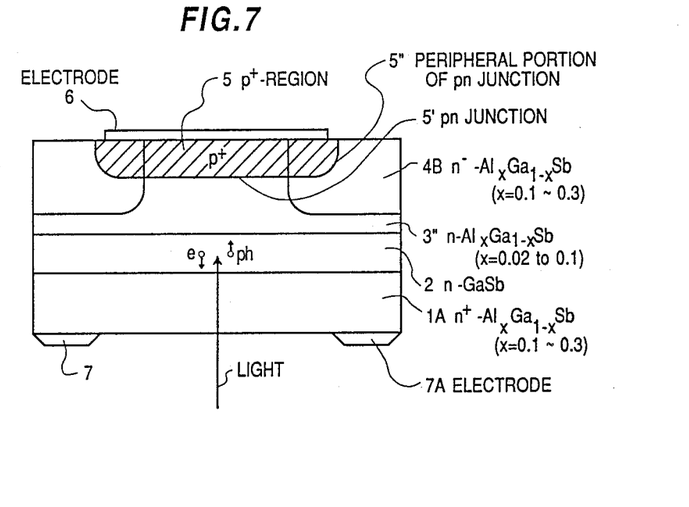
FIG. 7 is a schematic cross-sectional side view of a second embodiment of the present invention.

A second embodiment of the present invention is hereinafter described, with reference to FIG. 7, where the same or like numerals denote the same or corresponding portions. The substrate 1A and the light absorbing layer 2 are essentially the same and act respectively the same as those of the first embodiment shown in FIG. 5. An avalanche multiplication layer 3'' is formed on the light absorbing layer 2 of the same material and in essentially the same way as the first embodiment of FIG. 5. The avalanche multiplication layer 3'' has a thickness of, for example, 0.5 to 1.0 μm. Next, a peripheral portion of the deposited avalanche multiplication layer 3'' is removed by chemical etching so as to leave a mesa of the avalanche multiplication layer 3'', while the center portion is masked with a resist mask (not shown in the figure). Next, the etched peripheral portion of the avalanche multiplication layer 3'' is filled with n-type $Al_xGa_{1-x}Sb$ having x of approximately 0.3 doped with, for example, tellurium at an impurity concentration of $5 \times 10^{15}$ cm$^{-3}$ maximum, and typically $2 \times 10^{15}$ cm$^{-3}$. This step is typically performed by a widely used LPE technique, while the mask remains on the mesa, so as to form a guard ring 4B. Next, after removing the mask from the top of the mesa, a positive dopant is doped into the surfaces of the avalanche multiplication layer 3'' and the adjacent part of the guard ring 4B approximately 1 μm deep, typically by diffusing beryllium or ion implanting zinc, as much as typically $10^{19}$ cm$^{-3}$, as denoted by the hatched area 5. The p+ region 5 forms a pn junction 5' in the avalanche multiplication layer 3'' and the guard ring 4B. However, because the peripheral portion 5'' of the pn junction is located in the low impurity-doped guard ring 4B having a low ionization rate, the undesirably low voltage avalanche breakdown caused by an electric field concentration at the peripheral portion can be prevented. Accordingly, the avalanche breakdown takes place only at the center portion which has no undesirable electric field concentration. The direct contact of the pn junction with the avalanche multiplication layer 3'' is advantageous for inducing a high electric field intensity in the avalanche multiplication layer 3''.

Figure 8:
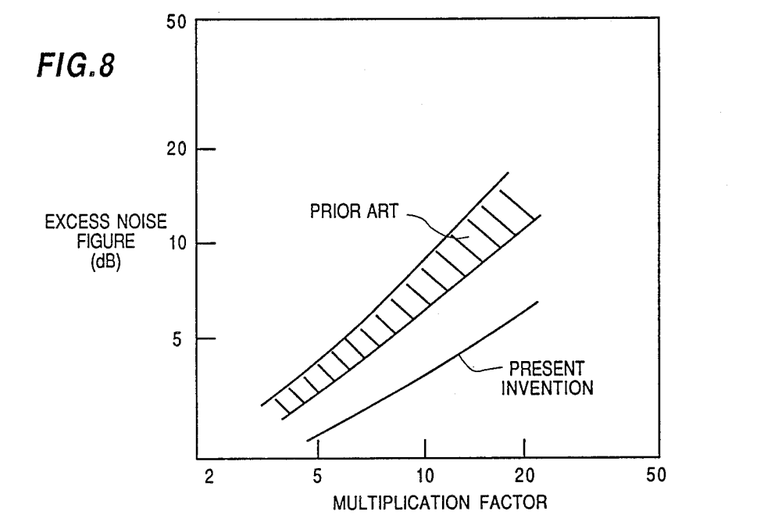
FIG. 8 is a graph for illustrating a comparison of noise figures achieved by the APD of the present invention and a prior art APD.

As shown in FIG. 8, at the multiplication factor of 10, an APD of the present invention achieved a noise figure as low as 3.8 dB compared with a figure of 6 to 9 dB for a prior art APD.

The mismatching of lattice constant of the crystals of the $Al_xGa_{1-x}Sb$ family with the GaSb light absorbing layer 2 slightly increases with an increase in the value of x. Accordingly, the $Al_xGa_{1-x}Sb$ for the layers 1A, 3 and/or 4 may be replaced with $Al_xGa_{1-x}Sb_yAs_{1-y}$ (aluminum gallium antimony arsenic) in order to achieve a better matching of the lattice constant with the GaSb. The values of y may be, for example, 0.01 to 0.03 in the substrate 1A; typically from 0.002 to 0.01 in the avalanche multiplication layer 3 (FIG. 5) or 3'' (FIG. 7); and typically from 0.01 to 0.03 in the surface layer 4A (FIG. 5) or the guard ring 4B (FIG. 7). The value of the antimony content ratio y causes essentially no effect on the above-described characteristics having various values of aluminum content x.

Although in the preferred embodiments of the present invention the electrode 7A is formed in a ring shape, so that the light is injected through the opening into the substrate 1A, it is apparent that the structure of the electrode 7A may be chosen arbitrarily as long as the bias voltage is properly applied to the APD device.

Due to the APD structure of the present invention, wherein the light is injected from a side opposite to the avalanche multiplication layer (3 or 3'') through a transparent substrate (1A), a deterioration of quantum efficiency of the APD is prevented, resulting in the achievement of both low noise and faster operation of the APD. Furthermore, due to the close location of the pn junction 5' to the avalanche multiplication 10 layer (3 or 3'') the design of the electric field in the avalanche multiplication layer (3 or 3'') is made simpler compared with prior art APD structures.

The many features and advantages of the invention are apparent from the detailed specification and thus, it is intended by the appended claims to cover all such features and advantages of the device which fall within the true spirit and scope of the invention. Further, since numerous modifications and changes will readily occur to those skilled in the art, it is not desired to limit the invention to the exact construction and operation shown and described, and accordingly, all suitable modifications and equivalents may be resorted to, falling within the scope of the invention.

What is claimed is:

1. A semiconductor photodiode, comprising:
   a substrate formed of one of an n-type $Al_xGa_{1-x}Sb$ semiconductor and an n-type $Al_xGa_{1-x}Sb_yAs_{1-y}$ semiconductor having a first band gap energy, where the aluminum content ratio x is within a range from 0.1 to 0.3 and the antimony content ratio y is within a range from 0 to 1, said substrate having a first surface for receiving light having a wavelength within a range of substantially 1.3 μm to 1.55 μm, a second surface, and a light receiving region;

a light absorbing layer formed of an n-type GaSb semiconductor on the second surface of said substrate, said light absorbing layer receiving the light passing through said substrate and producing carriers corresponding to the intensity of the received light;

a multiplication layer formed of one of an n-type $Al_{x'}Ga_{1-x'}Sb$ semiconductor and an n-type $Al_{x'}Ga_{1-x'}Sb_{y'}As_{1-y'}$ semiconductor, where the aluminum content ratio x' is within a range from 0.02 to 0.1, and the antimony content ratio y' is within a range from 0 to 1, said multiplication layer formed on said light absorbing layer, the aluminum content ratio x' in said avalanche multiplication layer being chosen so as to generate an essentially maximum ionization rate ratio of positive holes and electrons by a resonant impact ionization phenomenon;

a surface layer formed of one of an n-type $Al_{x''}Ga_{1-x''}Sb$ semiconductor and an n-type $Al_{x''}Ga_{1-x''}Sb_{y'}As_{1-y''}$ semiconductor on said multiplication layer, where the aluminum content ratio of x'' is within a range from 0 to 1 and the antimony content ratio y'' is within a range from 0 to 1; and an impurity region formed of a p-type semiconductor doped in said surface layer through a surface opposite from said multiplication layer;

a first electrode formed on said first surface of said substrate, through which a voltage is applied, said first electrode being shaped so as to allow incidence of the light into the light receiving region of said substrate; and a second electrode formed on said impurity region, through which a positive voltage is applied with respect to the voltage applied to said first electrode.

2. A semiconductor photodiode according to claim 1, wherein the aluminum content ratio x' is substantially 0.065 in said multiplicaton layer.

3. A semiconductor photodiode according to claim 1, wherein, in said surface layer, the aluminum content ratio X'' is within a range from 0.1 to 0.3, said surface layer has an impurity concentration which is less or equal to $5 \times 10^{15} cm^{-3}$, and said impurity region has an impurity concentration of substantially $10^{19} cm^{-3}$.

4. A semiconductor photodiode according to claim 1, wherein said first electrode is formed by a deposition of metallic material.

5. A semiconductor photodiode according to claim 1, wherein said second electrode is formed by a deposition of metallic material.

6. A semiconductor photodiode, comprising:

a substrate formed of one of an n-type $Al_xGa_{1-x}Sb$ semiconductor and an n-type $Al_xGa_{1-x}Sb_yAs_{1-y}$ semiconductor having a first band gap energy, where the aluminum content ratio x is within a range from 0.02 to 0.1 and the antimony content ratio y is within a ragne from 0 to 1, said substrate having a first surface for receiving light having wavelength within a range of substantially 1.3 μm to 1.55 μm, a second surface, and a light receiving region;

a light absorbing layer formed of an n-type GaSb semiconductor on the second surface of said substrate, said light absorbing layer receiving the light passing through said substrate and producing carriers corresponding to the intensity of the received light;

a multiplication layer formed of one of an n-type $Al_{x'}Ga_{1-x'}Sb$ semiconductor and an n-type $Al_{x'}Ga_{1-x'}Sb_{y'}As_{1-y'}$ semiconductor, where the aluminum content ratio x' is within a range from 0.02 to 0.1 and the antimony content ratio y' is within a range from 0 to 1, said multiplication layer formed on said light absorbing layer, the aluminum content ratio x' in said multiplication layer being chosen so as to generate an essentially maximum ionization rate ratio of positive holes and electrons by a resonant impact ionization phenomenon, said multiplication layer having a central portion and a peripheral portion with a thickness which is thinner than said central portion of said multiplication layer;

a guard ring region formed of one of an n-type $Al_{x''}Ga_{1-x''}Sb$ semiconductor and an n-type $Al_{x''}Ga_{1-x''}Sb_{y''}As_{1-y''}$ semiconductor on said peripheral portion of said multiplication layer, where the aluminum content ratio x'' is within a range from 0 to 1 and the antimony content ratio y'' is within a range from 0 to 1, said guard ring region being formed coplanarly with a surface of said central portion of said multiplication layer;

an impurity region formed of a p-type semiconductor doped in said multiplication layer and in an adjacent portion of said guard ring region, through surfaces opposite from said light absorbing layer;

a first electrode formed on said first surface of said substrate, through which a voltage is applied, said first electrode being shaped so as to allow an incidence of the light into the light receiving region of said substrate; and a second electrode formed on said impurity region, through which a positive voltage is applied with respect to the voltage applied to said first electrode.

7. A semiconductor photodiode according to claim 6, wherein the aluminum content ratio x' is substantially 0.065 in said multiplication layer.

8. A semiconductor photodiode according to claim 6, wherein, in said guard ring region, the aluminum content ratio x'' is within a range from 0.1 to 0.3, said guard ring region has an impurity concentration which is less or equal to $5 \times 10^{15} cm^{-3}$, and said impurity region has an impurity concentration of substantially $10^{19} cm^{-3}$.

9. A semiconductor photodiode according to claim 6, wherein said first electrode is formed by a deposition of metallic material.

10. A semiconductor photodiode according to claim 6, wherein said second electrode is formed by a deposition of metallic material.

11. A semiconductor photodiode, comprising:

a base layer made of a semiconductor having a first band gap energy and having a first surface for receiving light and a second surface, the light having a wavelength within a range of substantially 1.3 μm to 1.55 μm;

a light absorbing layer made of a semiconductor having a second band gap energy on said second surface of said base layer, said semiconductor having a second band gap energy being selected such that said light absorbing layer receives the light and produce carries;

a multiplication layer made of one of $Al_xGa_{1-x}Sb$ and $Al_xGa_{1-x}Sb_yAs_{1-y}$ having a third band gap energy and formed on said light absorbing layer, where the aluminum content ratio x is within a range from 0.02 to 0.1 and the antimony content ratio y is within a range from 0 to 1, the first band gap energy being larger than the second and third band gap energies;

a semiconductor surface layer formed on said multiplication layer;

an impurity region formed in said semiconductor surface layer, having a different conductivity from that of said semiconductor surface layer;

a first electrode formed on said first surface of said base layer through which is bias voltage is applied ; and a second electrode formed on said impurity region, through which said bias voltage is applied.

12. A semiconductor photodiode according to claim 11, wherein the aluminum content ratio x is substantially 0.065 in said multiplication layer.

13. A semiconductor photodiode according to claim 11, wherein said impurity region has an impurity concentration of substantially $10^{19} cm^{-3}$.

14. A semiconductor photodiode according to claim 11, wherein said first electrode is formed by a deposition of metallic material.

15. A semiconductor photodiode according to claim 11, wherein said electrode is formed by a deposition of metallic material.

16. A semiconductor photodiode, comprising:

a semiconductor substrate having a first band gap energy, having a first surface for receiving light and having a second surface, the light having a wavelength within a range of substantially 1.3 $\mu$m to 1.55 $\mu$m;

a light absorbing layer made of a semiconductor having a second band gap energy on said second surface of said semiconductor substrate;

a multiplication layer formed by a semiconductor having an aluminum content within a range from 0.02 to 0.1, said multiplication layer formed on said light absorbing layer and having a third band gap energy, the first band gap energy being greater than the second and third band gap energies;

an impurity region formed over said multiplication layer; and an electrode formed on part of the first surface of said substrate, said electrode being shaped so as to allow the light to penetrate said semiconductor substrate.

17. A semiconductor photodiode according to claim 16, wherein said multiplication layer is made of one of $Al_xGa_{1-x}Sb$ and $Al_xGa_{1-x}Sb_yAs_{1-y}$, where the antimony content ratio y is within a range from 0 to 1.

18. A semiconductor photodiode according to claim 17, wherein said light absorbing layer is formed of an n-type GaSb semiconductor.

19. A semiconductor photodiode according to claim 18, further comprising a surface layer formed of one of an n-type $Al_{x''}Ga_{1-x''}Sb$ semiconductor and an n-type $Al_{x''}Ga_{1-x}Sb_{y''}Sb_{y''}As_{1-y''}$ semiconductor between said multiplication layer and said impurity region, where the aluminum content ratio x'' is within a range from 0 to 1 and the antimony content ratio y'' is within a range from 0 to .

20. A semiconductor photodiode according to claim 19, wherein said impurity region is formed of a p-type semiconductor doped in a portion of said surface layer.

* * * * *

UNITED STATES PATENT AND TRADEMARK OFFICE
CERTIFICATE OF CORRECTION

PATENT NO. : 4,984,032
DATED : JANUARY 8, 1991
INVENTOR(S) : SHUICHI MIURA ET AL.

It is certified that error appears in the above-identified patent and that said Letters Patent is hereby corrected as shown below:

ON TITLE PAGE:  [57] ABSTRACT line 5, "an-type" should be --n-type--;
        line 7, "semiconduct," should be --semiconductor,--;
        line 12, "n-type" should be --$n^-$-type--.

Col. 1, line 12, "10" should be --1.0--;
        line 24, "n-" should be --$n^-$- --;
        line 32, "$p^{30}$-type" should be --$p^+$-type--;
        line 38, "o" should be --O.--;
        line 68, delete line because of printing errors and insert --which is schematically illustrated in FIG. 3. In FIG. 3,--.

Col. 2, line 24, "n" should be --$n^+$--;
        line 26, "$n^{30}$" should be --$n^+$--;
        line 31, "I," should be --1,--;
        line 40, "$p^{30}$-type" (both occurrences) should be --$p^+$-type--;
        line 44, "$p^{30}$-type" should be --$p^+$-type--;
        line 57, "$n^{30}$-type" should be --$n^+$-type--;
        line 67, "px-type" should be --$p^+$-type; and "layer or in a surface layer formed of N-type" should be deleted;
        line 68, "$Al_rGa_1$" should be --layer or in a surface layer formed of n-type $Al_xGa_1$--.

UNITED STATES PATENT AND TRADEMARK OFFICE
CERTIFICATE OF CORRECTION

PATENT NO. : 4,984,032
DATED : JANUARY 8, 1991
INVENTOR(S) : SHUICHI MIMURA ET AL.

It is certified that error appears in the above-identified patent and that said Letters Patent is hereby corrected as shown below:

Col. 3, line 2, "$0 < y < 11$," should be --$0 < y < 1$,--;
line 45, "$n^{30}$-type" should be --$n^{+}$-type--;
line 61, "IA" should be --1A--.

Col. 4, line 3, "n-type" should be --$n^{+}$-type--;
line 10, "$p^{30}$-type" should be --$p^{+}$-type--;
line 16, "$p^{30}$-type" should be --$p^{+}$-type--;
line 20, "$p^{30}$-type" should be --$p^{+}$-type--;
line 28, "IA" should be --1A--;
line 41, "IA" should be --1A--.

Col. 5, line 13, "IA" should be --1A--;
line 55, "n-type" should be --$n^{-}$-type--.

Col. 6, line 34, "IA" should be --1A--.

Col. 7, line 21, "$Sb_{y'}$-" should be --$Sb_{y''}$- --;
line 22, "'$As_{1-y}$'" should be --$As_{1-y''}$--;
line 44, " X" " should be --x"--;
line 60, "ragne" should be --range--;
line 61, after "having" insert --a--.

Col. 8, line 4, "$Al_{x-}$" should be --$Al_{x'}$- --;
line 5, "'Ga" should be --Ga--;
line 17, "$Al_{x-}$" should be --$Al_{x''}$- --;
line 18, " "Ga" should be --Ga--.

UNITED STATES PATENT AND TRADEMARK OFFICE
CERTIFICATE OF CORRECTION

PATENT NO. : 4,984,032
DATED : JANUARY 8, 1991
INVENTOR(S) : SHUICHI MIURA ET AL.

It is certified that error appears in the above-identified patent and that said Letters Patent is hereby corrected as shown below:

Col. 9, line 12, "is" should be --a--; and "applied" should be --applied;--;
line 13, "; and" should be --and--.

Col. 10, line 24, "n-type" (both occurrences) should be --n$^-$-type--;

line 25, "$Al_{x''Ga1-x}Sb_{y''}Sb_{y''}As_{1-y''}$" should be --$Al_{x''}Ga_{1-x}Sb_{y''}As_{1-y''}$--;

line 29, "0 to ." should be --0 to 1.--.

Signed and Sealed this

Seventh Day of July, 1992

Attest:

DOUGLAS B. COMER

Attesting Officer   Acting Commissioner of Patents and Trademarks